(12) United States Patent
Soree et al.

(10) Patent No.: US 7,880,163 B2
(45) Date of Patent: Feb. 1, 2011

(54) NANOSTRUCTURE INSULATED JUNCTION FIELD EFFECT TRANSISTOR

(75) Inventors: Bart Soree, Begijnendijk (BE); Wim Magnus, Waver (BE)

(73) Assignee: IMEC, Leuven (BE)

( * ) Notice: Subject to any disclaimer, the term of this patent is extended or adjusted under 35 U.S.C. 154(b) by 159 days.

(21) Appl. No.: 12/246,270

(22) Filed: Oct. 6, 2008

(65) Prior Publication Data

US 2010/0084632 A1 Apr. 8, 2010

(51) Int. Cl.
*H01L 31/00* (2006.01)
(52) U.S. Cl. .................... 257/24; 257/E29.168; 438/57; 977/938
(58) Field of Classification Search .................... 257/24, 257/E29.168; 438/57; 977/938
See application file for complete search history.

(56) References Cited

U.S. PATENT DOCUMENTS

2002/0117659 A1* 8/2002 Lieber et al. .................. 257/14
2006/0052947 A1* 3/2006 Hu .............................. 702/20
2008/0169503 A1* 7/2008 Appenzeller et al. ........ 257/327

OTHER PUBLICATIONS

"Electron Work Function Of The Elements" in CRC Handbook of Chemistry and Physics, Internet Version 2007, (87th edition), David R. Lide, ed., Taylor and Francis, Boca Raton FL.*
Chapeau-Blondeau et al., Numerical evaluation of the Lambert W-function and Application to Generation of Generalized Gaussian Noise with Exponent 1/2, IEEE Trans. Signal Processing, (2002), 2160-2165.
Flugge, S., "Practical quantum mechanics", Springer-Verlag, New York Heidelberg Berlin, (1974), 106-111.
Shockley, W., A Unipolar "Field Effect" Transistor Proceedings of the IRE, Nov. 1952, 13651376.
Soree et al., Analytical and self-consistent quantum mechanical model for a surrounding gate MOS nanowire operated in JFET mode, J. Comput. Electron., (2008), 7:380-383.

* cited by examiner

*Primary Examiner*—Bradley K Smith
*Assistant Examiner*—Jami M Valentine
(74) *Attorney, Agent, or Firm*—Knobbe Martens Olson & Bear LLP

(57) ABSTRACT

A novel nanostructure device operating in Junction Field Effect Transistor (JFET) mode is provided that avoids the majority of the carriers that interact with the interface (e.g. surface roughness, high-k scattering).

24 Claims, 8 Drawing Sheets

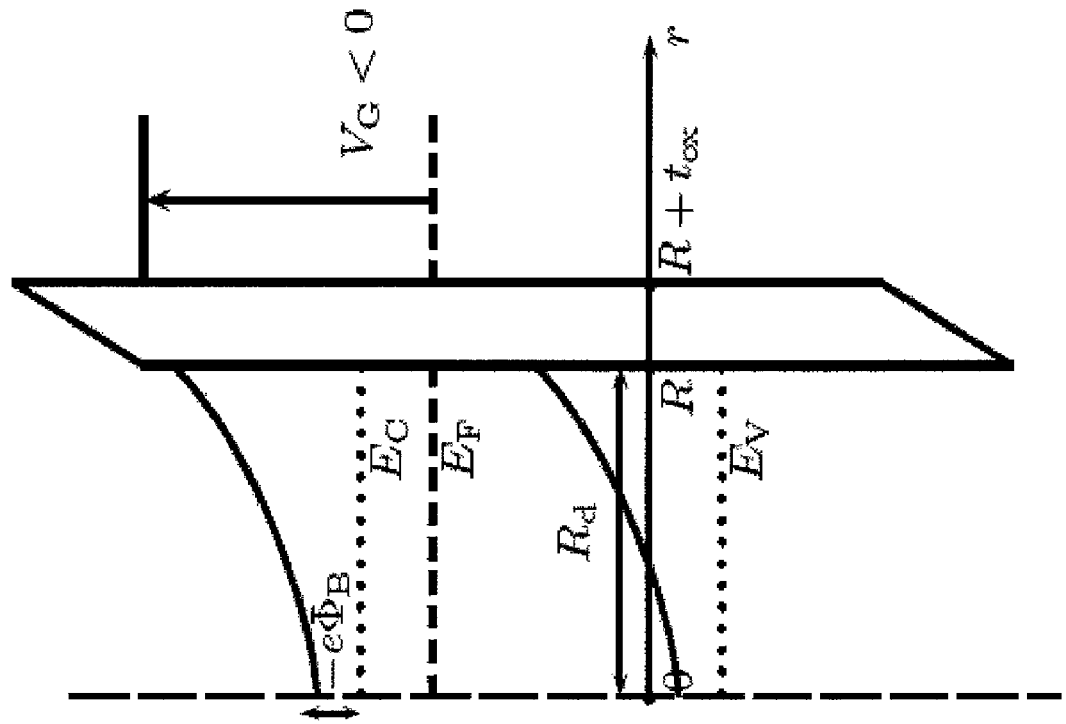
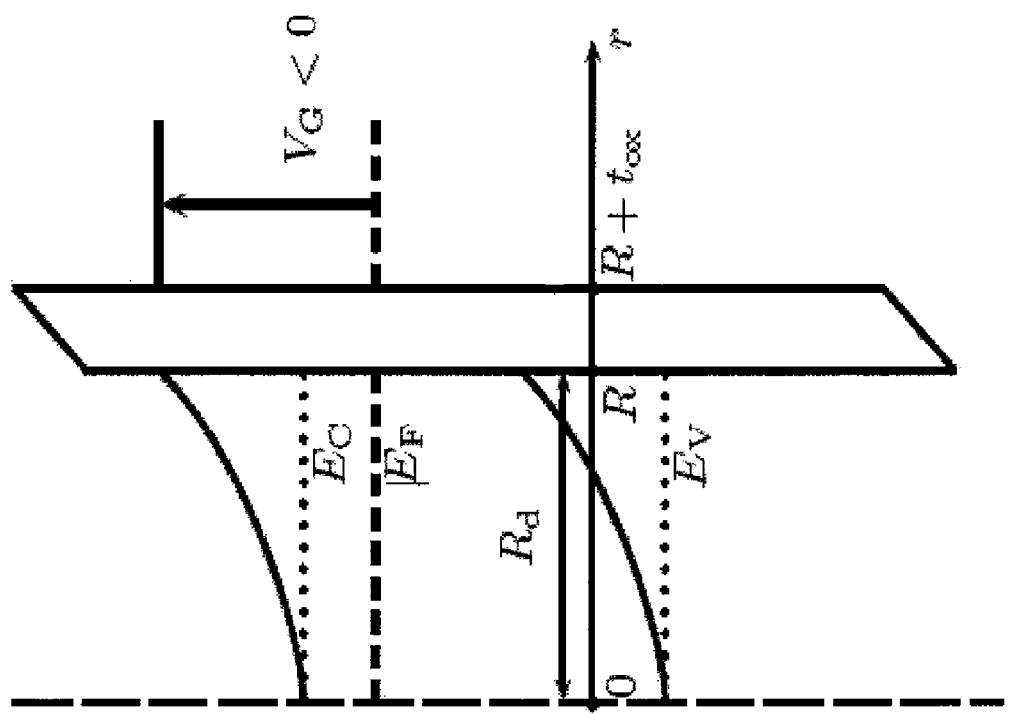
Figure 2D
Figure 2C

NANOSTRUCTURE INSULATED JUNCTION FIELD EFFECT TRANSISTOR

FIELD OF THE INVENTION

Semiconductor devices comprising nanostructures (e.g. Nanowires (NW)) are provided, namely, a Nanostructure insulated Junction Field Effect Transistor (iJFET) thereby avoiding surface interactions at the surface of the nanostructure. The improved semiconductor structure, which is preferably a semiconductor nanostructure, preferably has a cross-sectional dimension of not more than about 100 nm.

BACKGROUND OF THE INVENTION

Microelectronic devices are generally fabricated on semiconductor substrates as integrated circuits. A complementary metal-oxide-semiconductor (CMOS) field effect transistor (FET) is one of the core elements of the integrated circuits. Dimensions and operating voltages of CMOS transistors are continuously reduced, or scaled down, to obtain ever-higher performance and packaging density of the integrated circuits.

To further sustain this trend, novel nanostructures such as nanowires are explored as possible successors of the current state-of-art silicon devices.

However as nanowires are scaled down to smaller radii, the interaction of electrons with the surface of the nanowire become important and due to surface roughness of the nanowire this will become detrimental for the device performance due to mobility degradation.

As a result, surface roughness or high-k scattering becomes a dominant scattering mechanism that may depress the carrier mobility significantly, thus rendering nanowires useless for MOSFET operation.

As a conclusion, there is still a need for an improved FET design thereby avoiding surface interactions at the surface of the nanostructure.

SUMMARY OF THE INVENTION

A novel architecture for a semiconductor Field Effect Transistor (FET) is provided that is made of nanostructures such as nanowires, thereby avoiding surface interactions at the surface of the nanostructure due to sidewall roughness and hence avoiding that the majority of the charge carriers interacts with the interface of the nanostructure.

The devices of the preferred embodiments address this issue by using a uniformly doped nanostructure. Preferably said uniformly doped nanostructure is operating in a Junction FET (JFET) architecture mode having an insulator (e.g. oxide) in between the gate and the nanostructure (referred to as nano-iJFET).

The problem of reduced mobility in small radii nanostructures due to sidewall (surface) roughness of the nanostructure is hence eliminated by providing a surrounding gate nanostructure which is operated not in the "MOSFET mode" but in the "JFET mode". Said nanostructure is thereby surrounded by an insulating layer with a surrounded gate on top of said insulating layer wherein both the source and the drain as well as the body of the nanostructure are uniformly doped.

According to preferred embodiments, the Nano-iJFET comprises a cylindrical device or a device with an equivalent topology being characterized by a clearly defined central symmetry axis, nanometer sizes in the transverse directions and a uniform doping profile. The latter envisages a dopant concentration profile that is as uniform as possible, particularly along the longitudinal axis of the nanostructure.

According to preferred embodiments said nano-iJFET makes it possible to push the majority carriers (electrons) to the middle of the nanostructure when a negative gate voltage is applied. By pushing the majority carriers towards the middle of the nanostructure it is possible to form the channel in the middle of the nanostructure and not at the surface of the nanostructure. As a result the surface roughness scattering of the nanostructure plays a less to almost no role in the device operation (the same argument also applies to high-K surface modes).

According to preferred embodiments a nano-iJFET is disclosed said nano-iJFET is comprising at least one uniformly doped nanostructure having a radius R, a gate electrode and an insulating layer having a thickness $t_{ox}$ situated in between said nanostructure and said gate electrode wherein said insulating layer is covering the nanostructure along its longitudinal axis such that the gate electrode makes no direct contact to the nanostructure (or in other words the gate electrode is isolated from the nanostructure). Preferably the insulating layer and the gate electrode are completely wrapped around the nanostructure to form a wrap-around insulator and a wrap-around gate. Preferably the insulating layer is covering the nanostructure along the whole length (in longitudinal direction) of the nanostructure.

According to preferred embodiments said nanostructure is uniformly doped with a donor density $N_D$, whereby $N_D$ is in the range of $10^{16}$ cm$^{-3}$-$10^{20}$ cm$^{-3}$, preferably said $N_D$ is in the range of $10^{18}$ cm$^{-3}$-$10^{20}$ cm$^{-3}$ for nanostructures having a radius R in the range of 5 nm up to 20 nm.

According to preferred embodiments said nanostructure is a nanostructure having a length $L_N$ and a (small) radius R, whereby R is preferably in the range of 2 nm up to 20 nm and LN is in the range of 20 up to 100 nm, more preferably LN is around 60 nm.

According to preferred embodiments said uniformly doped nanostructure is an n-type or p-type doped nanowire, more preferably said n-type or p-type doped nanowire is an n-type or p-type doped nanowire made of a semiconductor material such as Si, Ge or GaAs, or a metal According to preferred embodiments the insulating layer used to form the wrap-around insulator has a length $L_I$ and is preferably made of an oxide layer e.g. SiO$_2$. During device operation, said insulating layer is crucial for preventing gate leakage in the nano-iJFET.

According to preferred embodiments said gate electrode is made of a conductive material, the conductive material preferably made of a metal with a work function ranging between 3 and 5 eV, and has a length $L_G$ which is such that $L_G \leq L_I$ such that the gate electrode is always isolated from the nanostructure and gate leakage is avoided.

It is further an advantage of the nano-iJFET of the preferred embodiments that Si based materials and process knowledge can be used to create the nano-iJFET such that the nano-iJFET can be easily processed and incorporated in current Si-based technology devices.

The nano-iJFET of the preferred embodiments can be readily integrated into CMOS circuits by using a fabrication process that is compatible with conventional CMOS processing steps. Devices comprising the nano-iJFET of the preferred embodiments are therefore also part of the preferred embodiments.

The above objective is accomplished by a method to fabricate the nano-iJFET according to preferred embodiments using state of the art processing steps.

Particular and preferred aspects are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the preferred embodiments will become apparent from the following detailed description, taken in conjunction with the accompanying drawings, which illustrate by way of example, the principles of the invention. This description is given for the sake of example only, without limiting the scope of the invention. The reference figures quoted below refer to the attached drawings.

BRIEF DESCRIPTION OF THE DRAWINGS

All figures are intended to illustrate some aspects and preferred embodiments. The figures are depicted in a simplified way for reason of clarity. Not all alternatives and options are shown and therefore the invention is not limited to the content of the given drawings. Like numerals are employed to reference like parts in the different figures.

FIGS. 2A-2D illustrate schematic representations of the band bending in an n-type nanowire iJFET of the preferred embodiments when a negative gate voltage is applied (FIGS. 2B-2D illustrate different negative gate voltages).

DETAILED DESCRIPTION OF THE PREFERRED EMBODIMENT

Figure 1A:
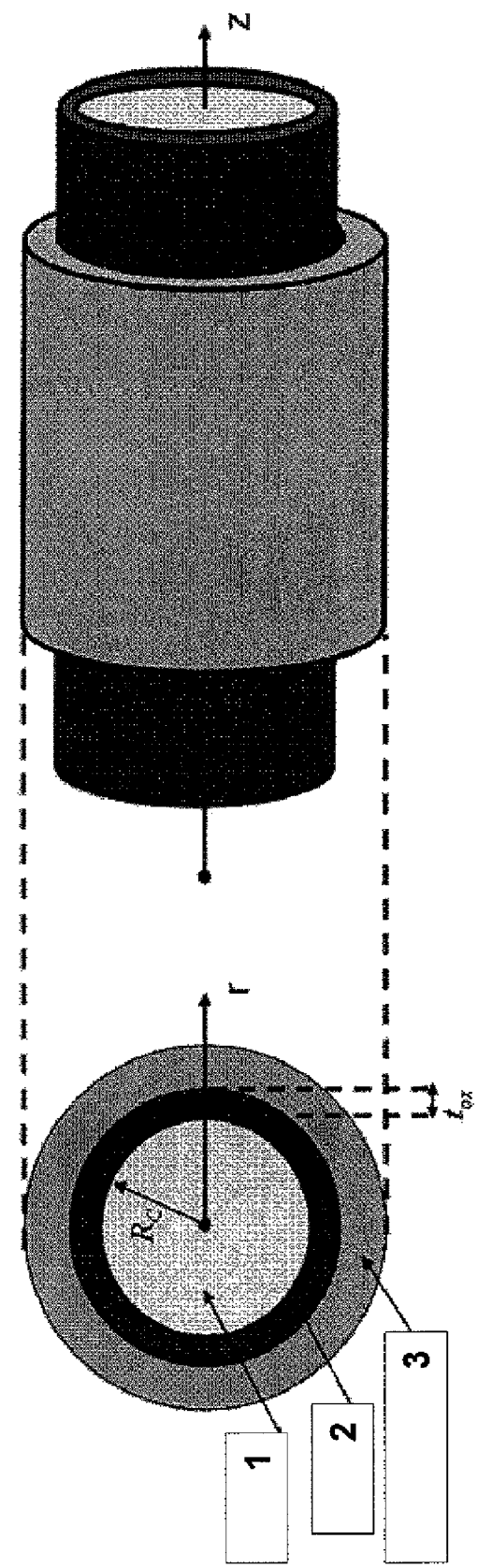
FIG. 1A illustrates a schematic representation of the nano-iJFET according to preferred embodiments along its longitudinal direction.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Moreover, the term top and the like in the description and the claims are used for descriptive purposes and not necessarily for describing relative positions. It is to be understood that the terms so used are interchangeable under appropriate circumstances and that the preferred embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the preferred embodiments. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure in one or more embodiments.

Similarly it should be appreciated that in the description of exemplary preferred embodiments, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that preferred embodiments may be practiced without these specific details. In other instances, well-known methods, structures and techniques have not been shown in detail in order not to obscure an understanding of this description.

The following terms are provided solely to aid in the understanding of the preferred embodiments. The terms "eigenvalues" and "eigenfunctions" as referred to in the description are used to define the solutions to the time-independent Schrödinger equation.

The invention will now be described by a detailed description of several preferred embodiments. It is clear that other preferred embodiments can be configured according to the knowledge of persons skilled in the art without departing from the true spirit or technical teaching of the invention as defined by the appended claims.

According to preferred embodiments a novel nanostructure device architecture is set up such that the advantages of using nanostructures such as outstanding electrostatic control can be fully exploited with a strongly reduced interaction of electrons at the surface (e.g. due to surface roughness) leading to unwanted decrease in mobility. According to preferred embodiments described below it is found that by combining the advantages of a "JFET operation" mode with a "MOSFET operation" mode a unique device operation is achieved whereby surface interactions are reduced by keeping the majority carriers in the middle of the nanostructure (JFET operation) using a wrap-around gate electrode and gate leakage is avoided by using a wrapped insulation layer in between the gate electrode and the nanostructure (MOSFET operation). This unique device architecture is further referred to as a nanostructure—insulted Junction Field Effect Transistor (nano-iJFET).

Figure 1B:
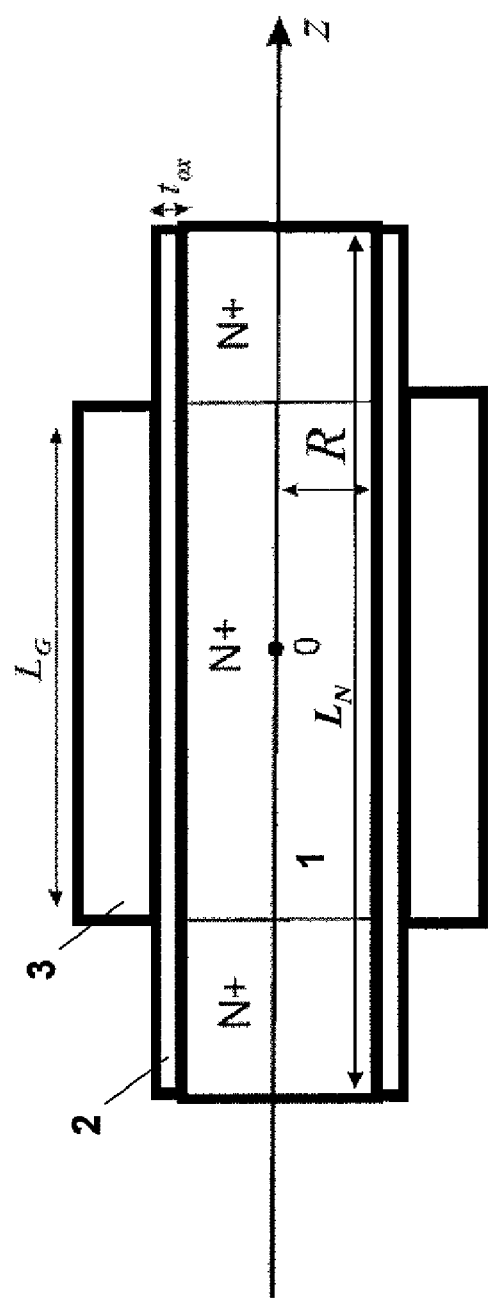
FIG. 1B illustrates a 3 dimensional representation of the nano-iJFET along its longitudinal direction and a cross section of the nano-iJFET.

FIG. 1A illustrates a schematic representation of the nano-iJFET according to preferred embodiments along its longitudinal direction. FIG. 1B illustrates a 3 dimensional representation of the nano-iJFET along its longitudinal direction and a cross section of the nano-iJFET. Said nano-iJFET is made of a uniformly doped nanostructure 1 having a length $L_N$ and having a radius R, a wrap-around gate electrode 3 having a length $L_G$ and a wrap-around insulating layer 2 having a thickness $t_{ox}$ situated in between said nanostructure 1 and said wrap-around gate electrode 3 wherein said insulating layer 2 is covering the nanostructure along its longitudinal axis such that the gate electrode 3 makes no direct contact to the nanostructure 1 (or in other words the gate electrode 3 is isolated from the nanostructure 1). Preferably the wrap around insulator 2 and the wrap-around gate electrode 3 are completely wrapped around the nanostructure 1. Preferably the wrap around insulator 2 is covering the nanostructure 1 along its whole length (in longitudinal direction).

According to preferred embodiments the nanostructure 1 is uniformly doped with a donor density $N_D$, whereby $N_D$ is in the range of $10^{16}$ cm$^{-3}$-$10^{20}$ cm$^{-3}$, preferably said $N_D$ is in the range of $10^{18}$ cm$^{-3}$-$10^{20}$ cm$^{-3}$ for nanostructures having a radius R in the range of 5 nm up to 20 nm.

According to preferred embodiments the nanostructure 1 is a nanowire 1 having a length $L_N$ and a (small) radius R, whereby R is preferably in the range of 2 nm up to 20 nm and $L_N$ is in the range of 20 up to 100 nm, more preferably $L_N$ is around 60 nm.

According to preferred embodiments the uniformly doped nanostructure 1 is an n-type or p-type doped nanowire 1, more preferably the n-type or p-type doped nanowire 1 is an n-type or p-type doped nanowire 1 made of a semiconductor material such as Si, Ge, GaAs or a metal.

According to preferred embodiments the insulating layer used to form the wrap-around insulator 2 has a length $L_I$ and is preferably made of an oxide layer e.g. SiO$_2$. During device operation, said wrap-around insulator 2 is crucial for preventing gate leakage in the nano-iJFET.

According to preferred embodiments the wrap-around gate electrode 3 is made of a conductive material with a workfunction between 3 to 5 and has a length $L_G$ which is such that $L_G \leq L_I$ such that the gate electrode 3 is always isolated from the nanostructure 1 and gate leakage is avoided.

Figures 2A, 2B:
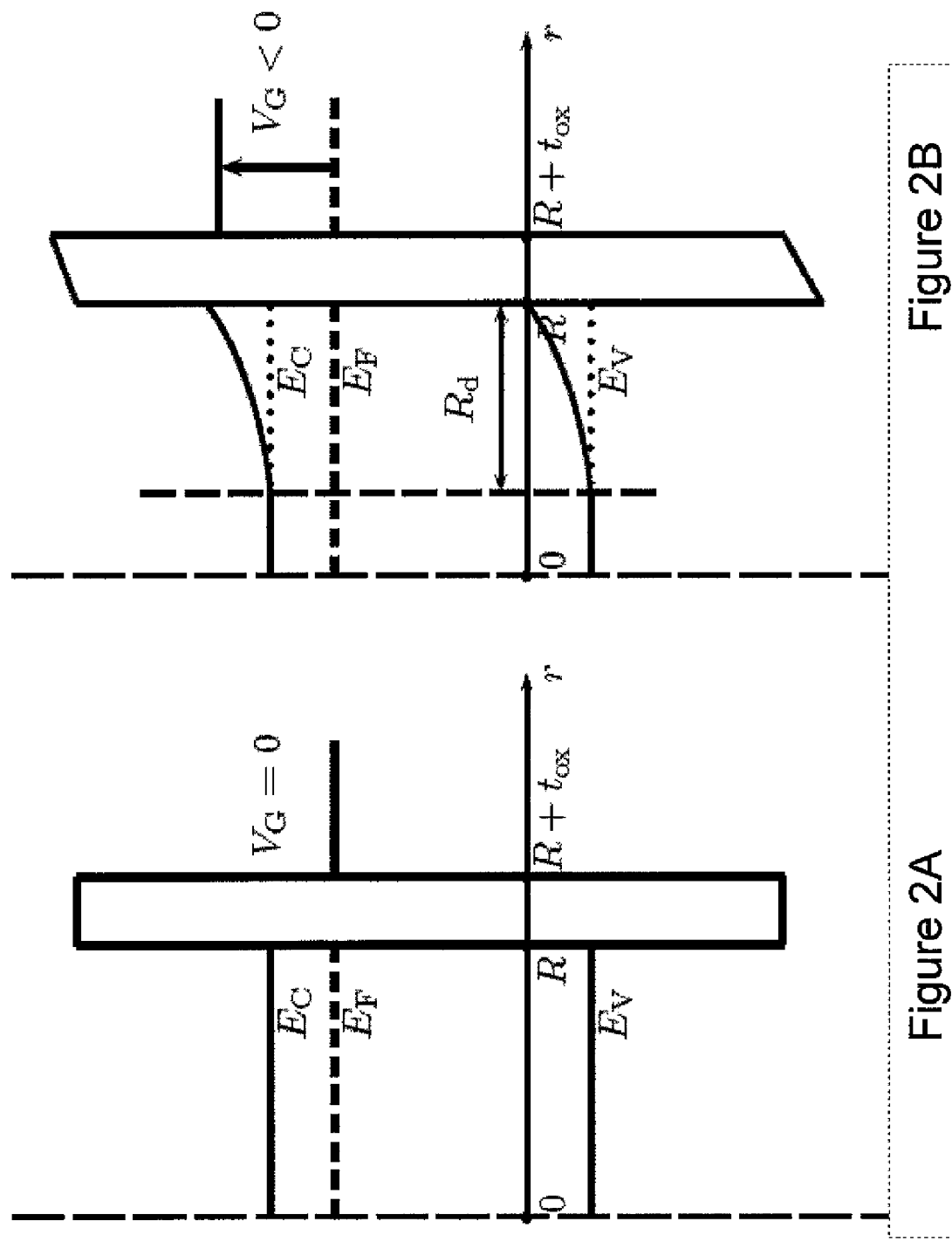

FIGS. 2A-2D illustrate schematic representations of the band bending in an n-type nano-iJFET of the preferred embodiments when a negative gate voltage is applied (FIGS. 2B-2D illustrate different negative gate voltages). If the gate voltage applied to the wrap around gate is set to zero and a source-drain voltage is applied, the wire is fully conducting a current carried by the majority carriers, i.e. electrons. Applying a negative gate voltage to the wrap around gate pushes the electrons away from the interface and for sufficient gate action the channel is pinched off. The nano-iJFET thus operates as a classical JFET (see W. Shockley, Proc. IRE, 40, p. 1365, (1952)), except for the presence of an insulator between the silicon channel and gate which is present to avoid excessive gate leakage.

In the embodiments below, an analytical model is applied to demonstrate the nano-iJFET operation for a nano-iJFET having a nanostructure (Si nanowire) with (large) radius R=10 nm. To demonstrate the nano-iJFET operation for a nano-iJFET having smaller nanostructures with radius R=5 nm self-consistent numerical calculations are performed to obtain the quantum mechanical electronic structure.

Analytical Model to Demonstrate the Nano-iJFET Operation for a Nano-iJFET with (Large) Radius R=10 nm For a nano-iJFET having rather large radii, an analytical model based on the gradual channel approximation (GCA) is used to demonstrate the device operation.

The calculation is started with the construction of the electrostatic potential for a given gate voltage $V_G$. For the charge density in the channel, abrupt depletion approximation is assumed, i.e. the charge density is given by:

$$\rho(r) = \begin{cases} eN_D & \text{if } R - R_d \leq r \leq R \\ 0 & \text{if } 0 \leq r < R - R_d, \end{cases} \quad (1)$$

where $R_d$ is the depletion length, while $N_D$ is the ionized donor density.

Next, the Poisson's equation is solved by assuming a long channel approximation in the region under the gate and zero source-drain voltage. As a result the electrostatic potential $\phi(r)$ is a function of the radial coordinate only, and Poisson's equation reduces to:

$$-\nabla \cdot E = \nabla^2 \Phi = \frac{1}{r}\frac{d}{dr}\left(r\frac{d\Phi}{dr}\right) = \frac{\rho(r)}{\epsilon_{si}} \quad (2)$$

for $0 \leq r \leq R$, i.e. inside the silicon body of the wire. After straightforward integration and imposing all the necessary boundary conditions the following expression for the electrostatic potential profile inside the nanowire silicon body is obtained:

$$\Phi_{Si}(r) = -\frac{eN_D}{4\epsilon_{si}}(r^2 - (R-R_d)^2) + \frac{eN_D}{2\epsilon_{si}}(R-R_d)^2 \ln\frac{r}{R-R_d} \quad (3)$$

for $R - R_d \leq r \leq R$, while $\phi_{Si}(r) = 0$ for $0 \leq r \leq R - R_d$. The electrostatic potential inside the oxide is given by:

$$\Phi_{ox}(r) = \frac{eN_D}{2\epsilon_{ox}}(R_d^2 - 2RR_d)\ln\frac{r}{R} + \qquad (4)$$

$$\frac{eN_D}{2\epsilon_{si}}(R-R_d)^2\ln\frac{R}{R-R_d} + \frac{eN_D}{4\epsilon_{si}}(R_d^2 - 2RR_d).$$

for $R \leq r \leq R+t_{ox}$.

To connect the electrostatic gate potential with the depletion length $R_d$, use is made of the boundary condition $\phi_G = \phi_{ox}(R+t_{ox})$ which results in:

$$\Phi_G = -\gamma(R^2 - (R-R_d)^2) + 2\alpha(R-R_d)^2 \ln\frac{R}{R-R_d} \qquad (5)$$

where:

$$\gamma = \alpha + \beta \ln\frac{R+t_{ox}}{R}, \quad \alpha = \frac{eN_D}{4\epsilon_{si}} \qquad (6)$$

and $$\beta = \frac{eN_D}{2\epsilon_{ox}}.$$

The calculation shows that the surface potential required to fully deplete the wire ($R_d=R$) is given by $\phi(R)=\phi_S=-\alpha R^2$, while the corresponding gate potential is $\phi_G=-\gamma R^2$. In order to have an acceptable pinch-off gate voltage the nanowire radius must be sufficiently small and/or the doping density $N_D$ has to be sufficiently low. On the other hand, the doping density determines the amount of current that flows when the device is turned on. Using the GCA it is possible to obtain an expression for the current above threshold. To calculate the source-drain current $I_{SD}$ it is preferred to start with the observation that the infinitesimal contribution to the resistance of a volume element with length $d_z$ is given by:

$$dR(z) = \frac{dz}{e\mu_n N_D \pi (R-R_d(z))^2} \qquad (7)$$

The factor $R-R_d(z)$ in the denominator of (7) is obtained by inverting expression (5):

$$R - R_d = e^{\gamma/2\alpha} R \left[ \frac{\Phi_G + \gamma R^2}{\alpha e^{\gamma/\alpha} R^2 W\left(-\frac{\Phi_G + \gamma R^2}{\alpha e^{\gamma/\alpha} R^2}\right)} \right]^{1/2} \qquad (8)$$

where W is the Lambert W-function which is the inverse of the function $z=we^w$ (see F. Chapeau-Blondeau et al., Numerical evaluation of the Lambert W-function and Application to Generation of Generalized Gaussian Noise with Exponent ½, IEEE Trans. Signal Processing, (2002), pp. 2160-2165). Replacing $\phi_G$ by $\phi_G-V(z)$ in equation (8) where V(z) is the potential variation in the z-direction due to the applied source-drain voltage, yields the desired expression for $R-R_d(z)$. This yields $dV(z)=I_{SD}dR(z)$, which gives after integration following:

$$I_{SD} = \frac{e\mu_n N_D \pi}{L} e^{\gamma/\alpha} R^2 \int_0^{V_{DS}} dV \times \left[ \frac{\Phi_G - V + \gamma R^2}{\alpha e^{\gamma/\alpha} R^2 W\left(-\frac{\Phi_G - V + \gamma R^2}{\alpha e^{\gamma/\alpha} R^2}\right)} \right]. \qquad (9)$$

Figure 3:
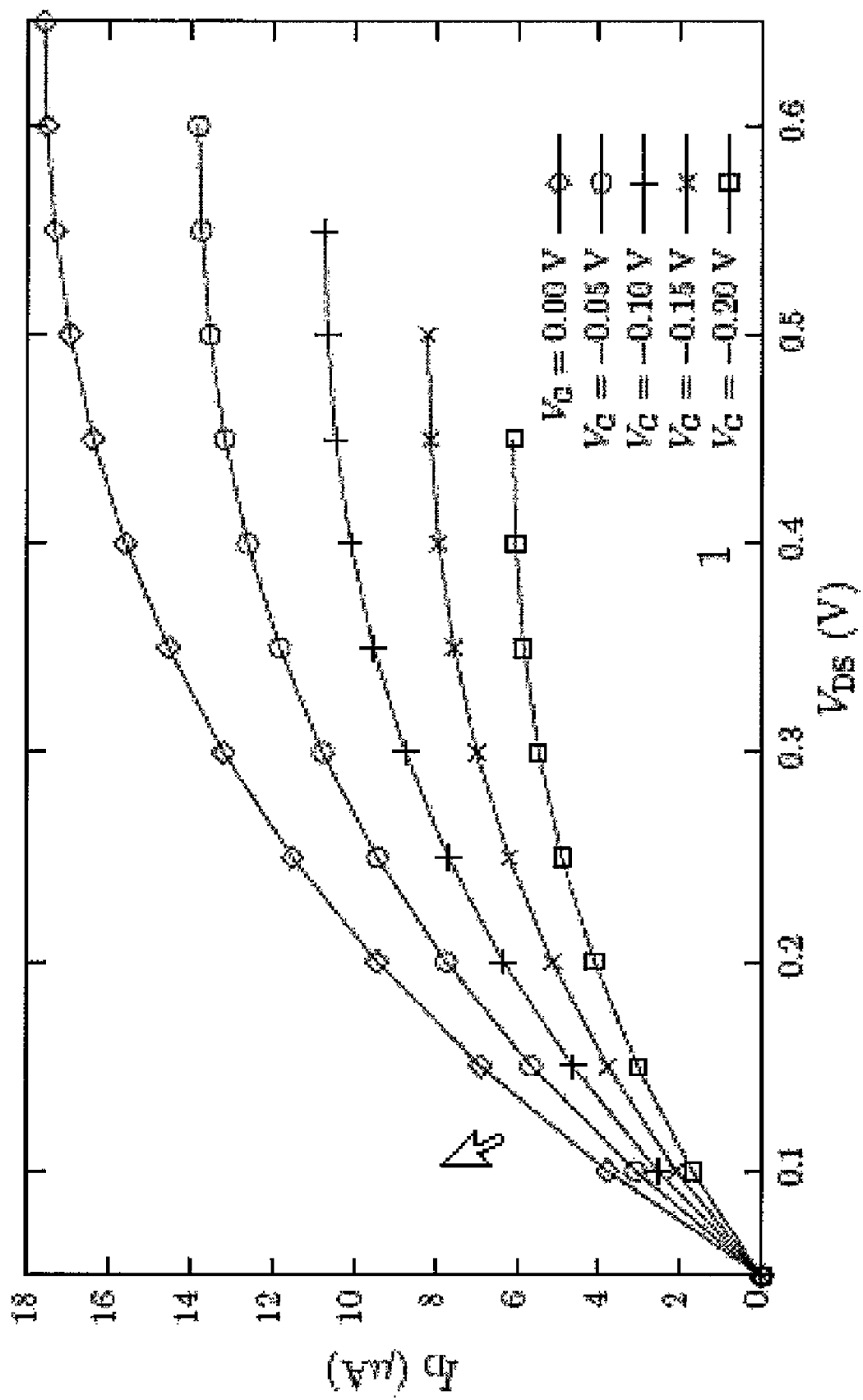
FIG. 3 illustrates drive current for a silicon nanowire with radius R=10 nm and donor density $N_D=10^{19}$ cm$^3$ and with oxide thickness $t_{ox}=1$ nm as a function of the source-drain voltage for a range of different negative gate voltages.

Equation (9) shows that the current is proportional with the nanowire mobility and donor doping density. The analytical model is conceived under the assumption that the nanowire radius is sufficiently large to replace the mobility with the corresponding bulk mobility for a given donor density. FIG. 3 shows the Current-Voltage (IV)-characteristics for a silicon nanowire with R=10 nm obtained from the GCA as described above.

The analytical model described above shows clearly that for the silicon nanowire iJFET (large radii) it is possible to switch the device off for a reasonable gate voltage.

Self-Consistent Numerical Calculations to Demonstrate the Nano-iJFET Operation for a Nano-iJFET with (Small) Radius R=5 nm For thin radii (R≦5 nm), a self-consistent quantum mechanical calculation (Poisson-Schrödinger) of the potential profile and the charge density in the JFET nanowire is performed. The electronic eigenfunctions are obtained from the following Schrödinger equation:

$$\left[ -\frac{\hbar^2 \nabla^2}{2m^*} - e\Phi(r) \right] \Psi = E\Psi \qquad (10)$$

Wherein a nanowire with $N_D=10^{20}$ cm$^{-3}$ and R=5 nm is considered. When the gate voltage $V_G$ is zero, the potential profile in the wire is flat and the electron eigenstates are Bessel functions. In the embodiment above (analytical model) the electrostatic potential is calculated in the abrupt depletion approximation. When this pinch-off gate voltage as calculated in the previous embodiment is applied, the electrostatic potential profile calculated in the abrupt depletion approximation inside the nanowire silicon body is purely parabolic:

$$\Phi(r) = -\frac{eN_D}{4\epsilon_{Si}} r^2. \qquad (11)$$

Figure 4:
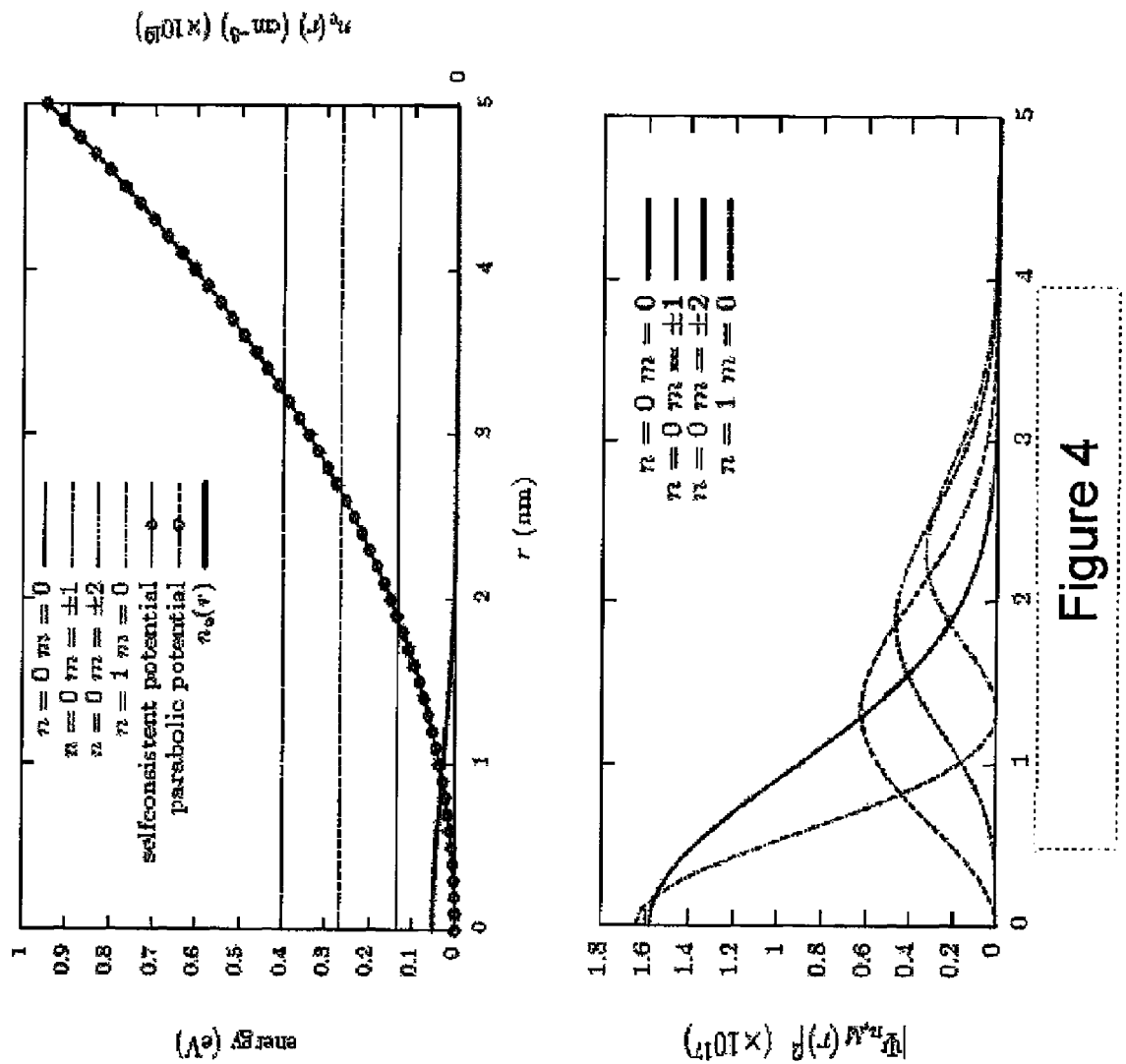
FIG. 4 illustrates the four lowest energy eigenvalues, potential energy profiles, eigenfunctions and electron density corresponding to a particular valley for a R=5 nm Si NW in full depletion with $N_D=10^{20}$ cm$^{-3}$ corresponding to a gate voltage of $V_G=-0.95$ V. The two highest eigenvalues are degenerate.

When performing the self-consistent Poisson-Schrödinger calculation using the same pinch-off gate voltage, it is observed that the self-consistent electrostatic potential is very close to the parabolic one. For this case, FIG. 4 illustrates the result of the self-consistent Poisson-Schrödinger calculation of the four lowest energy eigenstates in a particular valley of the silicon conduction band together with the potential energy profile and the corresponding eigenfunctions. It is clear from this FIG. 4 that the self-consistent potential energy profile is very close to the parabolic potential given by Equation (11). As a result, it is concluded that the parabolic potential may be used as an approximation when the JFET nanowire is in pinch-off for thin nanowires. In this case, the associated electron eigenfunctions are very close to those of the circular harmonic oscillator problem when the energy levels are sufficiently deep in the parabolic well. The total energy is given by $E_{knm} = \hbar^2 k^2 / 2m^* + \epsilon_{nm}$, where the corresponding subband energies are given by:

$$\epsilon_{nm} = \hbar\omega(2n+|m|+1) \qquad (12)$$

for n=0, 1, 2 ... and m=0,±1,±2, ..., while the eigenfunctions are:

$$\Psi_{nm} = C_{nm} r^{|m|} e^{-\lambda r^2/2} e^{im\phi} e^{ikz} F_1(-n, |m|+1, \lambda r^2) \Gamma \quad (13)$$

where $F_1$ is the solution to the Kummer equation, i.e. the confluent series, while $$\lambda = \frac{m^* \omega}{\hbar} \quad (14)$$

with $$\omega = \left(\frac{e^2 N_D}{2m^* \epsilon_{Si}}\right)^{\frac{1}{2}}.$$

FIG. 4 clearly shows that the deeper lying energy eigenstates are equidistant and that the n=1, m=0 and n=0, m=±2 eigenenergies corresponding to $\epsilon = 3 \hbar \omega$ are degenerate. Equations (12)-(13) yield explicit expressions for the lowest eigenenergies and normalized eigenfunctions:

$$\Psi_{00}(r, \phi) = \sqrt{\lambda/\pi} \, e^{-\lambda r^2/2} e^{ikz}$$

with $$\epsilon_{00} = \hbar\omega, \Psi_{0\pm 1}(r, \phi)$$
$$= \lambda/\sqrt{\pi} \, r e^{-\lambda r^2/2} e^{\pm i\phi} e^{ikz}$$
$$\epsilon_{01} = 2\hbar\omega, \Psi_{0\pm 2}(r, \phi)$$
$$= \sqrt{\lambda/2\pi} \, \lambda r^2 e^{-\lambda r^2/2} e^{\pm 2i\phi} e^{ikz}$$
$$\epsilon_{02} = 3\hbar\omega$$
$$\Psi_{10}(r, \phi) = \sqrt{\lambda/\pi} \, e^{-\lambda r^2/2} (1 - \lambda r^2) e^{ikz}$$
$$\epsilon_{10} \stackrel{1}{=} 3\hbar\omega$$

Figure 5:
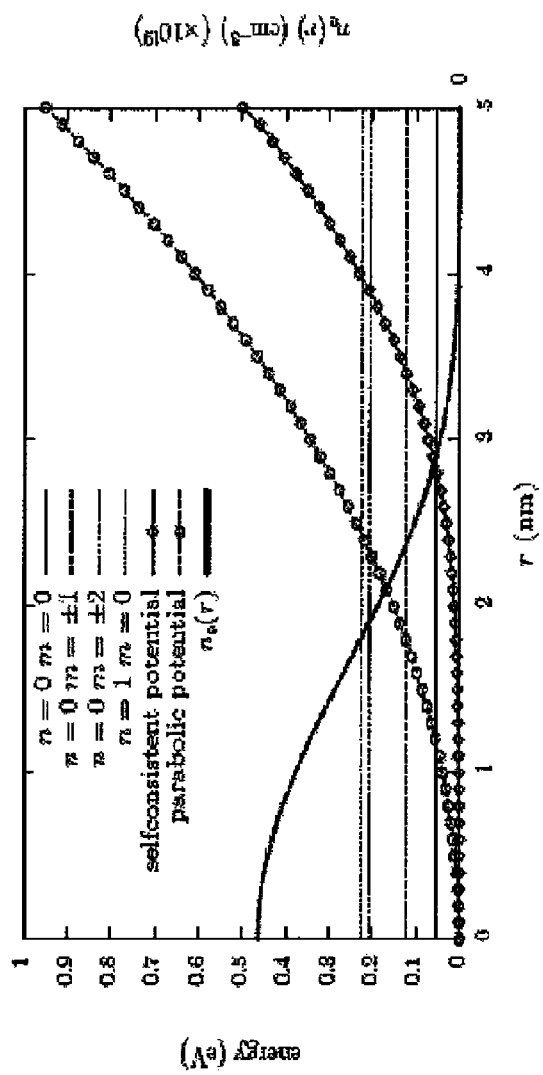
FIG. 5 illustrates the four lowest energy eigenvalues, potential energy profiles, eigenfunctions and electron density corresponding to a particular valley for a R=5 nm Si wire with $N_D=10^{20}$ cm$^{-3}$ and $V_G=-0.5$ V. The channel is not fully open nor is it pinched off.
Figure 5:
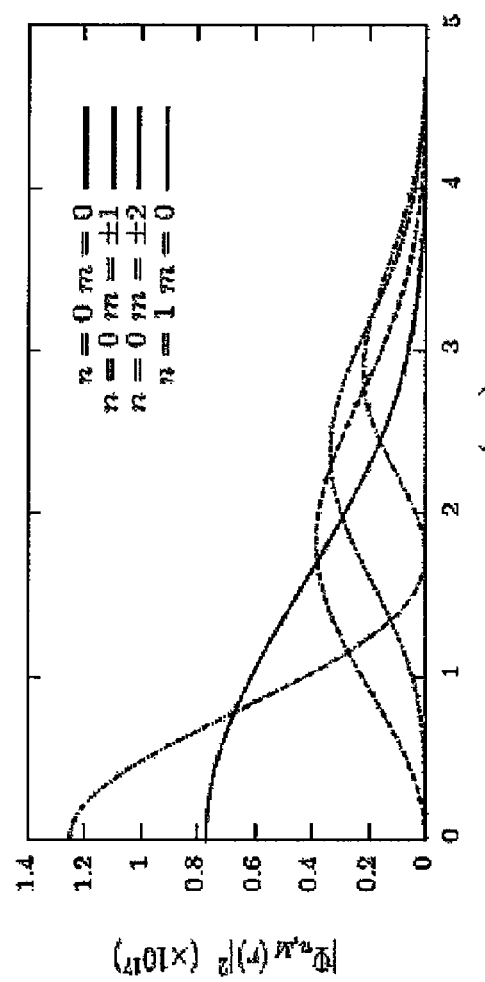

In FIG. 5 the results for a less negative $V_G$ are illustrated. The self-consistent potential deviates from the parabolic potential and the eigenfunctions need to be calculated self-consistently. Also, the aforementioned degeneracy is lifted. In FIGS. 4-5 the electron density $n_e(r)$ is plotted:

$$n_e(r) = 2 \times \sum_{knm} F(E_{knm}) |\Psi_{knm}(r)|^2. \quad (15)$$

The factor 2 in front of Equation 15 arises from spin degeneracy, while F is the Fermi-Dirac distribution function. The Fermi-level is determined by requiring global charge neutrality inside the wire.

The self-consistent quantum mechanical model described above and applied to obtain the electronic structure of the Nano-iJFET having a radius R=5 nm shows clearly that for the on and off states of the nanowire the eigenfunctions and energy levels can be calculated analytically, while for intermediate VG it is possible to obtain self-consistent numerical solutions.

Electron Mobility for a Nano-iJFET with (Small) Radius R=2.5 nm and R=5 nm

Figure 6:
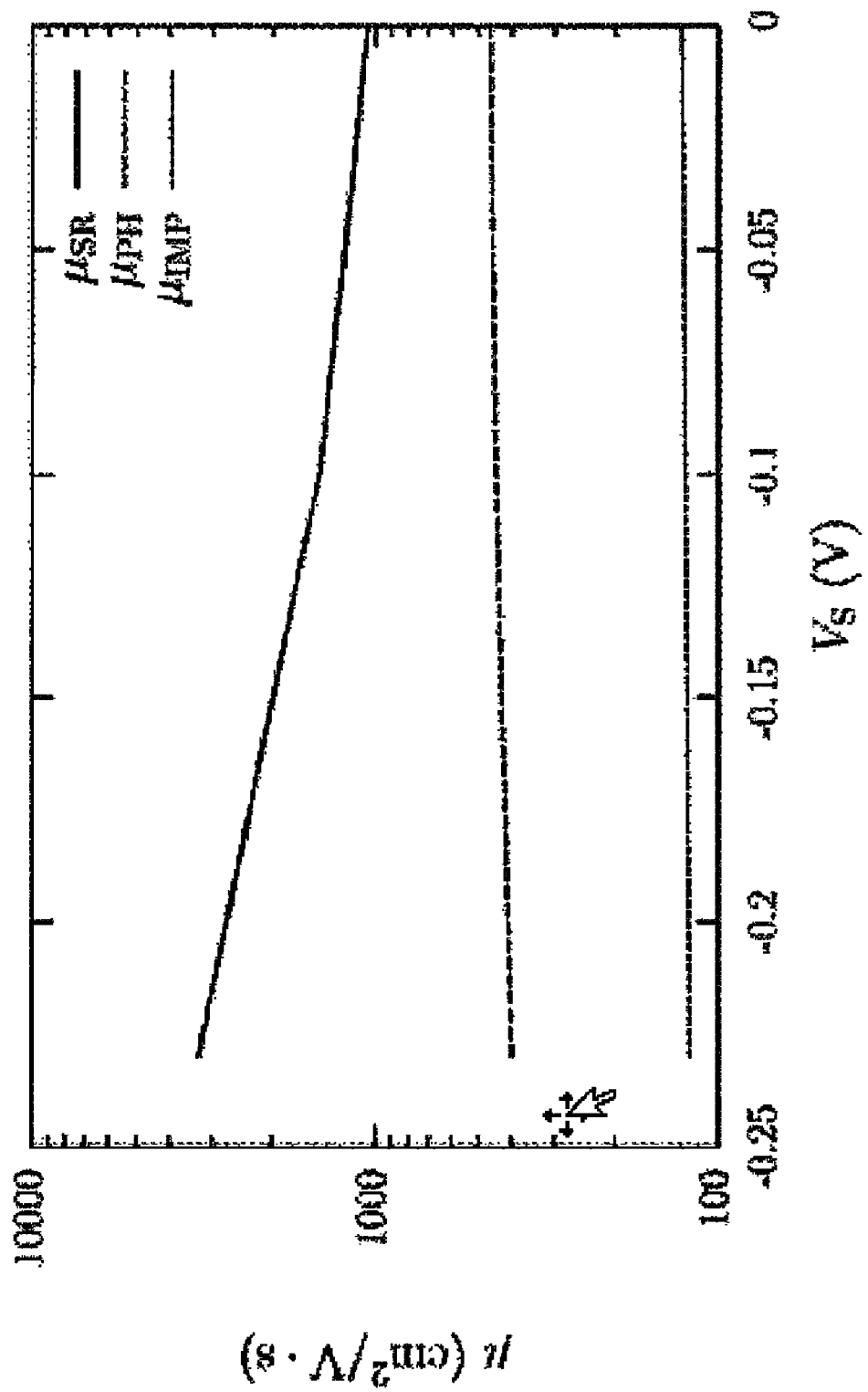
FIG. 6 illustrates the low field mobilities for an R=2.5 nm nanowire iJFET. The dominant scattering mechanism is due to ionized impurities. Surface roughness mobility is decreasing as the surface voltage is increased, i.e. as electrons start to interact more with the surface.

FIG. 6 illustrates the low field mobilities for an R=2.5 nm nanowire iJFET. The dominant scattering mechanism is due to ionized impurities. Surface roughness mobility is decreasing as the surface voltage is increased, i.e. as electrons start to interact more with the surface.

Figure 7:
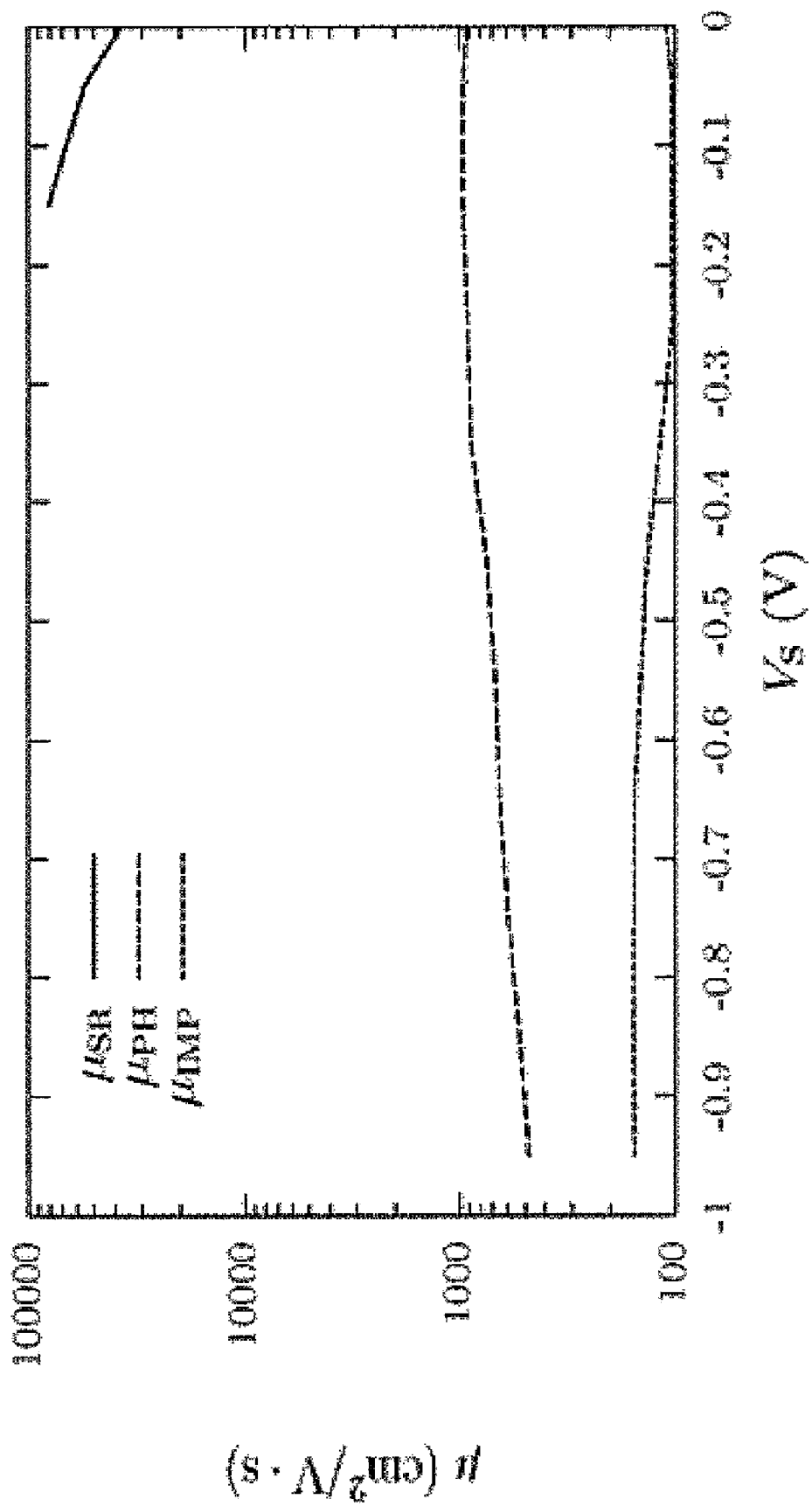
FIG. 7 illustrates the low field mobilities for an R=5 nm nanowire iJFET. The dominant scattering mechanism is due to ionized impurities. Surface roughness mobility plays no significant role because the majority of the carriers reside in the middle of the wire.

FIG. 7 illustrates the low field mobilities for an R=5 nm nanowire iJFET. The dominant scattering mechanism is due to ionized impurities. Surface roughness mobility plays no significant role because the majority of the carriers reside in the middle of the wire.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A nanostructure-insulated junction field effect transistor comprising:
   a uniformly doped nanostructure having a length $L_N$ and a radius R, wherein the uniformly doped nanostructure has a dopant concentration profile that is uniform along the central symmetry axis and the longitudinal axis;
   a gate electrode wrapped at least partially around the uniformly doped nanostructure and having a length $L_G$; and
   an insulating layer having a thickness $t_{ox}$ wrapped at least partially around the uniformly doped nanostructure and situated in between the uniformly doped nanostructure and the gate electrode, wherein the insulating layer covers the uniformly doped nanostructure along its longitudinal axis such that the gate electrode makes no direct contact with the uniformly doped nanostructure.

2. The nanostructure-insulated junction field effect transistor of claim 1, wherein the uniformly doped nanostructure is uniformly doped with a donor density $N_D$, wherein $N_D$ is from about $10^{16}$ cm$^{-3}$ to about $10^{20}$ cm$^{-3}$.

3. The nanostructure-insulated junction field effect transistor of claim 1, wherein the uniformly doped nanostructure is uniformly doped with a donor density $N_D$, wherein $N_D$ is from about $10^{18}$ cm$^{-3}$ to about $10^{20}$ cm$^{-3}$, and wherein R is from about 5 nm to about 20 nm.

4. The nanostructure-insulated junction field effect transistor of claim 1, wherein the uniformly doped nanostructure is a uniformly doped nanowire, wherein R is from about 2 nm to about 20 nm and $L_N$ is from about 20 to about 100 nm.

5. The nanostructure-insulated junction field effect transistor of claim 1, wherein the uniformly doped nanostructure is a uniformly doped nanowire, wherein R is from about 2 nm to about 20 nm and $L_N$ is about 60 nm.

6. The nanostructure-insulated junction field effect transistor of claim 1, wherein the uniformly doped nanostructure is uniformly doped with an n-type dopant.

7. The nanostructure-insulated junction field effect transistor of claim 1, wherein the uniformly doped nanostructure is uniformly doped with a p-type dopant.

8. The nanostructure-insulated junction field effect transistor of claim 1, wherein the uniformly doped nanostructure is an n-type uniformly doped nanowire comprising at least one material selected from the group consisting of Si, Ge, GaAs, and a metal.

9. The nanostructure-insulated junction field effect transistor of claim 1, wherein the uniformly doped nanostructure is a p-type uniformly doped nanowire comprising at least one material selected from the group consisting of Si, Ge, GaAs, and a metal.

10. The nanostructure-insulated junction field effect transistor of claim 1, wherein a portion of the insulating layer wrapped around the uniformly doped nanostructure has a length $L_I$ and comprises an oxide layer.

11. The nanostructure-insulated junction field effect transistor of claim 10, wherein the oxide layer comprises $SiO_2$.

12. A nanostructure-insulated junction field effect transistor comprising:
a uniformly doped nanostructure having a length $L_N$ and a radius R;
a gate electrode wrapped at least partially around the uniformly doped nanostructure and having a length $L_G$; and
an insulating layer having a thickness $t_{ox}$ wrapped at least partially around the uniformly doped nanostructure and situated in between the uniformly doped nanostructure and the gate electrode, wherein the insulating layer covers the uniformly doped nanostructure along its longitudinal axis such that the gate electrode makes no direct contact with the uniformly doped nanostructure, wherein a portion of the insulating layer wrapped around the uniformly doped nanostructure has a length $L_I$ and comprises an oxide layer, and wherein the gate electrode comprises a conductive material with a workfunction of from about 3 to about 5, and wherein $L_G \leq L_I$.

13. The nanostructure-insulated junction field effect transistor of claim 1, wherein the insulating layer and the gate electrode are completely wrapped around the uniformly doped nanostructure.

14. The nanostructure-insulated junction field effect transistor of claim 1, wherein the insulating layer covers the uniformly doped nanostructure along its whole length in a longitudinal direction.

15. The nanostructure-insulated junction field effect transistor of claim 12, wherein the uniformly doped nanostructure is uniformly doped with a donor density $N_D$, wherein $N_D$ is from about $10^{16}$ cm$^{-3}$ to about $10^{20}$ cm$^{-3}$.

16. The nanostructure-insulated junction field effect transistor of claim 12, wherein the uniformly doped nanostructure is uniformly doped with a donor density $N_D$, wherein $N_D$ is from about $10^{18}$ cm$^{-3}$ to about $10^{20}$ cm$^{-3}$, and wherein R is from about 5 nm to about 20 nm.

17. The nanostructure-insulated junction field effect transistor of claim 12, wherein the uniformly doped nanostructure is a uniformly doped nanowire, wherein R is from about 2 nm to about 20 nm and $L_N$ is from about 20 to about 100 nm.

18. The nanostructure-insulated junction field effect transistor of claim 12, wherein the uniformly doped nanostructure is a uniformly doped nanowire, wherein R is from about 2 nm to about 20 nm and $L_N$ is about 60 nm.

19. The nanostructure-insulated junction field effect transistor of claim 12, wherein the uniformly doped nanostructure is uniformly doped with an n-type dopant.

20. The nanostructure-insulated junction field effect transistor of claim 12, wherein the uniformly doped nanostructure is uniformly doped with a p-type dopant.

21. The nanostructure-insulated junction field effect transistor of claim 12, wherein the uniformly doped nanostructure is an n-type uniformly doped nanowire comprising at least one material selected from the group consisting of Si, Ge, GaAs, and a metal.

22. The nanostructure-insulated junction field effect transistor of claim 12, wherein the uniformly doped nanostructure is a p-type uniformly doped nanowire comprising at least one material selected from the group consisting of Si, Ge, GaAs, and a metal.

23. The nanostructure-insulated junction field effect transistor of claim 12, wherein the insulating layer and the gate electrode are completely wrapped around the uniformly doped nanostructure.

24. The nanostructure-insulated junction field effect transistor of claim 12, wherein the insulating layer covers the uniformly doped nanostructure along its whole length in a longitudinal direction.

* * * * *